US012635327B2

(12) United States Patent
Ito

(10) Patent No.: US 12,635,327 B2
(45) Date of Patent: May 19, 2026

(54) DISPLAY DEVICE HAVING CONNECTION PADS AT MULTIPLE EDGES AND COMPOSITE DISPLAY DEVICE

(71) Applicant: KYOCERA Corporation, Kyoto (JP)

(72) Inventor: Hiroaki Ito, Ritto (JP)

(73) Assignee: KYOCERA Corporation, Kyoto (JP)

( * ) Notice: Subject to any disclaimer, the term of this patent is extended or adjusted under 35 U.S.C. 154(b) by 413 days.

(21) Appl. No.: 18/265,950

(22) PCT Filed: Dec. 1, 2021

(86) PCT No.: PCT/JP2021/044113
§ 371 (c)(1),
(2) Date: Jun. 7, 2023

(87) PCT Pub. No.: WO2022/124161
PCT Pub. Date: Jun. 16, 2022

(65) Prior Publication Data
US 2024/0038954 A1 Feb. 1, 2024

(30) Foreign Application Priority Data

Dec. 8, 2020 (JP) ................................. 2020-203733

(51) Int. Cl.
| *H10H 29/49* | (2025.01) |
| *H01L 25/075* | (2006.01) |
| *H01L 25/16* | (2023.01) |
| *H10D 86/40* | (2025.01) |
(Continued)

(52) U.S. Cl.
CPC ......... *H10H 29/49* (2025.01); *H01L 25/0753* (2013.01); *H01L 25/167* (2013.01); *H10D 86/441* (2025.01); *H10D 86/60* (2025.01); *H10H 29/45* (2025.01)

(58) Field of Classification Search
CPC .... H10H 20/857; H10H 29/142; H10H 29/49; H10H 29/45; H01L 25/0753; H01L 25/167; H10D 86/441; H10D 86/60; G09F 9/30; G09F 9/33
See application file for complete search history.

(56) References Cited

U.S. PATENT DOCUMENTS

| 4,481,511 A | 11/1984 | Hanmura et al. |
| 10,614,738 B2 * | 4/2020 | Aurongzeb ........... G06F 1/1681 |
| 2005/0104822 A1 | 5/2005 | Seki |
(Continued)

FOREIGN PATENT DOCUMENTS

| CN | 109637451 A | 4/2019 |
| JP | S57-114189 A | 7/1982 |
(Continued)

*Primary Examiner* — Tan N Tran
(74) *Attorney, Agent, or Firm* — Procopio, Cory, Hargreaves & Savitch LLP

(57) ABSTRACT
A display device includes a substrate including a first side and a second side adjoining the first side, a plurality of light emitters located on the substrate, a plurality of emission control signal lines located on the substrate to control an emission state or a non-emission state of the plurality of light emitters, and a plurality of connection pads located at an edge adjacent to the first side of the substrate and at an edge adjacent to the second side of the substrate. The plurality of connection pads is connected to the plurality of emission control signal lines.

16 Claims, 10 Drawing Sheets

(51) Int. Cl.
H10D 86/60 (2025.01)
H10H 29/45 (2025.01)

(56) References Cited

U.S. PATENT DOCUMENTS

| | | | |
|---|---|---|---|
| 2018/0190631 A1 | 7/2018 | Kim et al. | |
| 2018/0323180 A1 | 11/2018 | Cok | |
| 2021/0351205 A1* | 11/2021 | Jang | H10K 85/113 |

FOREIGN PATENT DOCUMENTS

| | | | |
|---|---|---|---|
| JP | 2003-295785 A | 10/2003 |
| JP | 2005-148248 A | 6/2005 |
| JP | 2005-221598 A | 8/2005 |
| JP | 2007-335429 A | 12/2007 |
| JP | 2012-104497 A | 5/2012 |

* cited by examiner

Laser beam

DISPLAY DEVICE HAVING CONNECTION PADS AT MULTIPLE EDGES AND COMPOSITE DISPLAY DEVICE

TECHNICAL FIELD

The present disclosure relates to a display device including self-luminous light emitters such as light-emitting diodes (LEDs), and a composite display device including multiple display devices that are joined (tiled) to one another.

BACKGROUND OF INVENTION

A known display device and a known composite display device are described in, for example, Patent Literatures 1 to 5.

CITATION LIST

Patent Literature

Patent Literature 1: Japanese Unexamined Patent Application Publication No. 2005-148248
Patent Literature 2: Japanese Unexamined Patent Application Publication No. 57-114189
Patent Literature 3: Japanese Unexamined Patent Application Publication No. 2003-295785
Patent Literature 4: Japanese Unexamined Patent Application Publication No. 2012-104497
Patent Literature 5: Japanese Unexamined Patent Application Publication No. 2007-335429

SUMMARY

In an aspect of the present disclosure, a display device includes a substrate including a first side and a second side adjoining the first side, a plurality of light emitters located on the substrate, a plurality of emission control signal lines located on the substrate to control an emission state or a non-emission state of the plurality of light emitters, and a plurality of connection pads located at an edge adjacent to the first side of the substrate and at an edge adjacent to the second side of the substrate. The plurality of connection pads is connected to the plurality of emission control signal lines.

In another aspect of the present disclosure, a composite display device includes a plurality of the display devices being joined to one another on side surfaces of the plurality of display devices. The plurality of display devices includes a first display device and a second display device. The first display device and the second display device are joined to each other on a side surface of the first display device adjoining the first side and a side surface of the second display device facing the side surface of the first display device.

BRIEF DESCRIPTION OF THE DRAWINGS

The objects, features, and advantages of the present invention will become more apparent from the following detailed description and the drawings.

DESCRIPTION OF EMBODIMENTS

Figure 1:
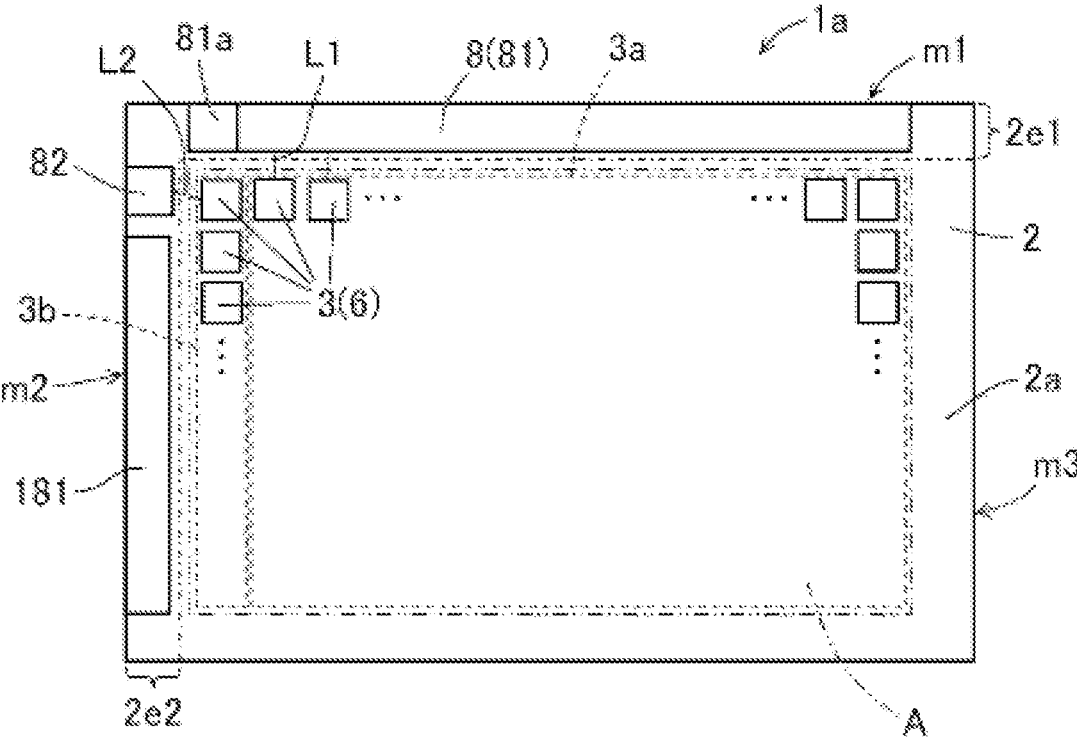
FIG. 1 is a schematic plan view of a display device according to an embodiment of the present disclosure.

The objects, features, and advantages of the present invention will become more apparent from the following detailed description and the drawings.

The structure that forms the basis of a display device according to one or more embodiments of the present disclosure will now be described. A known large composite display device, which is also referred to as a multi-display or a tiling panel, includes multiple display devices that are arranged planarly and tiled to one another. For a composite display device including multiple self-luminous display devices, each of the multiple display devices is to have either a minimum or no frame portion as a non-display area outside an active display area. Each of the multiple display devices may include a substrate that receives light emitters on one main surface (front surface), a drive on the other main surface (back surface), and side wires located on the side surfaces of the substrate and electrically connecting the light emitters and the drive. This structure includes one side wire connection pad at an edge of one main surface of the substrate to be connected to the side wire, and another side wire connection pad at an edge of the other main surface of the substrate to be connected to the side wire.

The above structure may be used for a self-luminous display device including micro-LED (μLED) elements as light emitters. Known organic electroluminescent (EL) display devices include organic EL elements. An organic EL display device (refer to, for example, Patent Literatures 1 to 5) includes the substrate with a first surface (front surface or display surface) having a matrix of multiple pixel units including pixel circuits including thin-film transistors (TFTs) to drive and control the organic EL elements.

Multiple self-luminous display devices each having the structure described above may be joined into a composite display device as a multi-display device with the structure noted below. Multiple pixel units arranged in an outermost array on a side to be joined in a single display device and multiple pixel units arranged in an outermost array on a side to be joined in another display device to be joined to the single display device are to have a pixel pitch between them (also referred to as a joint pixel pitch) substantially equal to or the same as a pixel pitch (also referred to as a non-joint pixel pitch) of multiple pixel units excluding those arranged in the outermost array of the display devices. When the joint pixel pitch is larger than the non-joint pixel pitch, the continuity of a display image at the joint is likely to decrease. This may cause a viewer to feel discomfort in the display image and cause the joint to be easily noticeable.

In the self-luminous display device, each of the multiple pixel units is connected to an emission control signal line that provides an emission control signal for controlling the emission or non-emission state of the light emitters. Each connection pad is connected to the emission control signal line and located in the frame portion (inactive portion) outside the display portion (active portion) including the multiple pixel units on one main surface of the substrate. Each connection pad is also connected to the side wire formed by applying and firing a conductive paste and thus is not easily miniaturized compared with, for example, emission control signal lines or electrode pads of the pixel units connected to the light emitters, which are formed with a thin film deposition technique. This causes the multiple connection pads, when placed along one side of the substrate corresponding to the smaller pixel pitch, to be placed at a smaller distance between them. Thus, all the multiple connection pads may not be easily placed. Further, each of the connection pads having a smaller area tends to have a smaller contact area with the side wire and tends to have larger contact resistance. This may cause unevenness in the display image and degrade the display performance. Additionally, the multiple connection pads placed at the smaller distance are likely to have short-circuiting between them.

In the structure above, when all the multiple connection pads are placed in the frame portion along one side of the substrate without precisely corresponding to the pixel pitch, the frame portion tends to have a larger width and a larger length. With the frame portion having a larger width, the joint pixel pitch tends to be larger than the smaller non-joint pixel pitch. In other words, the joint pixel pitch cannot be easily equal to the non-joint pixel pitch. With the frame portion with a larger length in a direction along one side of the substrate adjoining one side of the substrate.

To reduce the size of the frame portion, the connection pads may be placed between outermost pixel units along one side of the substrate. However, the number of connection pads that can be placed along one side of the substrate is equal to the number of pixel units minus one. In this structure, not all the connection pads can be placed along one side of the substrate. Techniques responding to such various issues described above are awaited.

A display device according to one or more embodiments of the present disclosure will now be described with reference to the accompanying drawings.

In one or more embodiments of the present disclosure, a display device includes, as illustrated in FIG. 1, a substrate 2 including a first side m1 and a second side m2 adjoining the first side m1, multiple light emitters 6 (illustrated in FIG. 3) located on the substrate 2, multiple emission control signal lines L1 and L2 located on the substrate 2 to control an emission state or a non-emission state of the light emitters 6, and multiple connection pads 8 located at an edge 2e1 adjacent to the first side m1 of the substrate 2 and at an edge 2e2 adjacent to the second side m2 of the substrate 2. The connection pads 8 are connected to the multiple emission control signal lines L1 and L2. FIG. 1 illustrates pixel units denoted with reference numeral 3 each including a light emitter 6. For example, the multiple pixel units 3 are arranged in a matrix in an active area A on a first surface 2a of the substrate 2.

In one or more embodiments of the present disclosure, the display device with the above structure produces the effects described below. The multiple connection pads 8 that are not easily miniaturized are located at the edge 2e1 adjacent to the first side m1 and at the edge 2e2 adjacent to the second side m2 on the substrate 2, and are thus spaced from each other at a distance to reduce short-circuiting between them. Thus, the multiple connection pads 8 are arranged on the substrate 2 without the frame portion (substantially corresponding to each of the edges 2e1 and 2e2) being larger, and are less likely to have short-circuiting between the connection pads 8. The multiple connection pads 8 can be arranged on the substrate 2 with the frame portion being smaller.

The edge 2e1 is a peripheral side edge along the first side m1 and has a width of about 10 to 500 μm from the first side m1 of the first surface 2a toward the center of the first surface 2a of the substrate 2. The edge 2e1 may have a width other than these values. The edge 2e1 may have a width less than or equal to about a half of the pixel pitch. The edge 2e2 and an edge 2e3 (illustrated in FIG. 2) have the same or similar structure to the edge 2e1. Each connection pad 8 has a rectangular shape with each side having a length of about 50 to 500 μm, or specifically about 70 to 300 μm, but may have a length other than these values. Each connection pad 8 may have one of various shapes, such as a trapezoid, a circle, an oval, or a polygon including a pentagon. A range of values referred to herein as one value to another value intends to mean the two values being inclusive.

Figure 11:
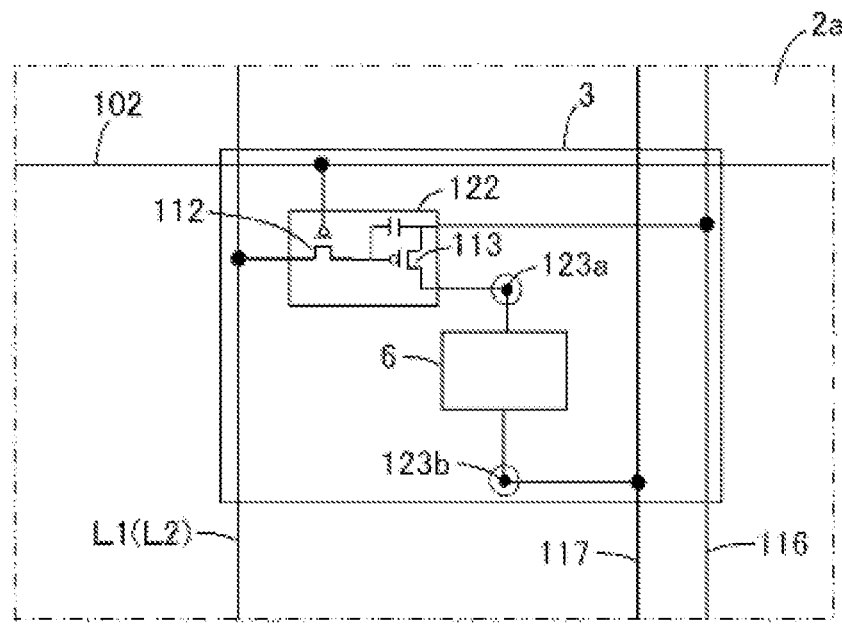
FIG. 11 is a circuit diagram of the display device according to one or more embodiments of the present disclosure, illustrating the structure of a pixel circuit.

In one or more embodiments of the present disclosure, the display device includes the multiple emission control signal lines L1 and L2 for controlling the emission or non-emission state of the light emitters 6. Each of the emission control signal lines L1 and L2 has the structure and functions described below. As illustrated in FIG. 11, the display device includes a scanning signal line (gate signal line) 102 extending in a predetermined direction (e.g., a row direction) on the first surface 2a of the substrate 2, the emission control signal line L1 (L2) intersecting with the scanning signal line 102 to extend in a direction (e.g., a column direction) intersecting with the predetermined direction, the multiple pixel units 3, each defined by the scanning signal line 102 and the emission control signal line L1 (L2), and the light emitter 6 included in each of the multiple pixel units 3. The scanning signal line 102 and the emission control signal line L1 (L2) are connected to a back wire on a second surface (back surface) 2b of the substrate 2 with a side wire 10 on a side surface 2c of the substrate 2. The back wire is connected to a drive including a drive element, such as an IC or an LSI circuit, mounted on the second surface 2b. In other words, the display in the display device is driven and controlled by the drive on the back surface of the substrate 2.

Each pixel unit 3 includes an emission controller 122 for controlling, for example, the emission or non-emission state and the light intensity of the corresponding light emitter 6. The emission controller 122 includes a thin film transistor (TFT) 112 as a switch element for inputting an emission signal into the light emitter 6, and a TFT 113 as a drive element for driving the light emitter 6 with a current based on an electric potential difference (emission signal) between a positive voltage (anode voltage of about 3 to 15 V) and a negative voltage (cathode voltage of about −3 to 3 V) corresponding to the voltage level of an emission control signal (a signal transmitted through the emission control signal line L1 (L2)). In other words, the emission control signal line L1 (L2) is connected to a source electrode of the TFT 112, a gate voltage of the TFT 113 is controlled by the voltage level of the emission control signal, and a source-drain current of the TFT 113 in accordance with the gate voltage level controls the luminance of the light emitter 6. A connection line connecting a gate electrode and a source electrode of the TFT 113 receives a capacitor, which retains the voltage of the emission control signal input into the gate electrode of the TFT 113 until subsequent rewriting is performed (for a period of one frame).

The light emitter 6 is electrically connected to the emission controller 122, a positive power supply (VDD) input line 116, and a negative power supply (VSS) input line 117 with feedthrough conductors 123a and 123b, such as a through-hole extending through an insulating layer underneath. In other words, the light emitter 6 has the positive electrode connected to the positive power supply input line 116 with the feedthrough conductor 123a and the emission controller 122, and has the negative electrode connected to the negative power supply input line 117 with the feedthrough conductor 123b.

FIG. 1 is a schematic plan view of a display device 1a according to one embodiment of the present disclosure. The display device 1a being self-luminous has the structure described below. The multiple connection pads 8 include multiple first connection pads 81 located along the first side m1 of the substrate 2 at the edge 2e1 adjacent to the first side m1 and connected to the first emission control signal line L1 for controlling the emission or non-emission state of each light emitter 6 in a first group 3a of the multiple light emitters 6, and a second connection pad 82 located at the edge 2e2 adjacent to the second side m2 of the substrate 2 and connected to the second emission control signal line L2 for controlling the emission or non-emission state of each light emitter 6 in a second group 3b of the multiple light emitters 6. In this structure, the multiple first connection pads 81 as a majority of the multiple connection pads 8 are spaced from one another at the edge 2e1 at the distance to reduce short-circuiting between them, and the second connection pad 82 as the remaining one of the multiple connection pads 8 that cannot be at the edge 2e1 can be placed on the edge 2e2. Thus, the connection pads 8 are arranged on the substrate 2 reliably without the frame portion being larger. This structure reduces short-circuiting between the connection pads 8. The distance to reduce short-circuiting is about 30 to 100 μm, but is not limited to these values and may be changed as appropriate. The light emitters 6 in the second group 3b may be the light emitters 6 included in a group of the pixel units 3 in an array nearest the second side m2 in the multiple pixel units 3 arranged in a matrix. For the light emitters 6 in the second group 3b as the light emitters 6 included in a group of the pixel units 3 in two arrays nearest the second side m2 in the multiple pixel units 3 arranged in a matrix, for example, two second connection pads 82 may be placed, or three or more second connection pads 82 may be placed.

Figure 5:
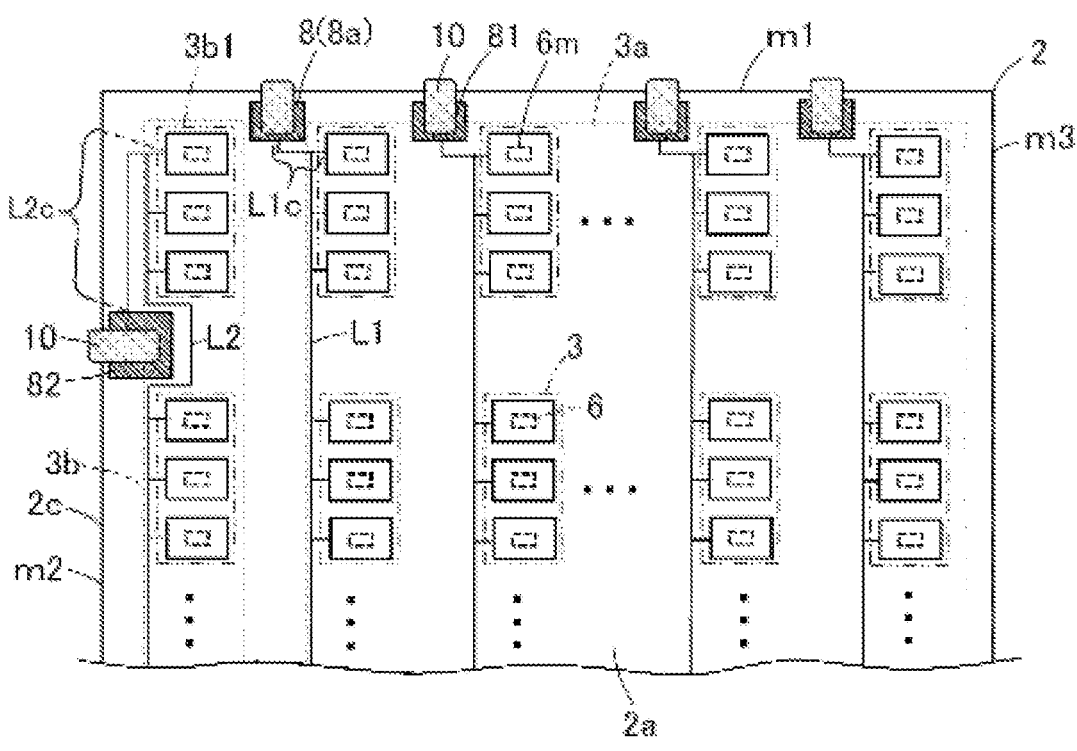
FIG. 5 is a partial plan view of the display device in FIG. 1, illustrating wiring in its main part.

The display device in FIG. 1 may include another connection pad located at the edge 2e2 adjacent to the second side m2 of the substrate 2 and connected to a wire other than the second emission control signal line L2. The second connection pad 82 may be located closer to the first side than the other connection pad. In this structure, as illustrated in FIG. 5, a connection section connecting each first connection pad 81 on the first emission control signal line L1 to the pixel unit 3 (light emitter 6) nearest the corresponding first connection pad 81 can have a length (length L1c) approximate to the length (length L2c) of a connection section connecting the second connection pad 82 on the second emission control signal line L2 to a pixel unit 3b1 nearest the second connection pad 82. This structure minimizes a difference between the length L1c and the length L2c. In this structure, the length of the second emission control signal line L2 is substantially equal to the length of the first emission control signal line L1, and the resistance of the second emission control signal line L2 is substantially equal to the resistance of the first emission control signal line L1. This can reduce any mismatch in the current value and the voltage level between the emission control signal transmitted through the first emission control signal line L1 and the emission control signal transmitted through the second emission control signal line L2 in response to the same emission control signal input into the first emission control signal line L1 and the second emission control signal line L2. The display device thus provides higher display performance. Additionally, the structure including the second connection pad 82 can reduce decreased flexibility in the layout of various wires on the second surface 2b of the substrate 2. This structure facilitates the layout of various wires on the second surface 2b of the substrate 2.

The second connection pad 82 may adjoin a first connection pad 81a nearest the second side m2 in the multiple first connection pads 81. This structure increases the above effects.

The other connection pad described above may be a power supply connection pad 181 (illustrated in FIG. 9) connected to a power supply wire for supplying a power supply current to the light emitters 6, or may be a fifth connection pad 18 (illustrated in FIG. 9) connected to a gate signal line 4.

In the display device 1a of FIG. 1, as illustrated in FIG. 5, the multiple light emitters 6 may include multiple outermost light emitters 6m located along the first side m1 of the substrate 2 at the edge 2e1 adjacent to the first side m1. Each first connection pad 81 may be located between the outermost light emitters 6m. In this structure, each first connection pad 81 can be located between the outermost pixel units 3 along the first side m1 of the substrate 2. The frame portion along the first side m1 can be further smaller. However, the number of connection pads 8 that can be located along the first side m1 of the substrate 2 is the number of pixels minus one. Not all the connection pads 8 can be placed along the first side m1 of the substrate 2. The remaining one (second connection pad 82) of the multiple connection pads 8 is to be placed at the edge 2e2 adjacent to the second side m2.

As illustrated in FIG. 5, the display device 1a may include the light emitters 6 in the second group 3b located along the edge 2e2 adjacent to the second side m2. The second connection pad 82 may be located between the second groups 3b including the light emitters 6. In this structure, the second connection pad 82 can be located between the outermost pixel units 3 along the second side m2 of the substrate 2. The frame portion along the second side m2 can be further smaller.

Figure 7:
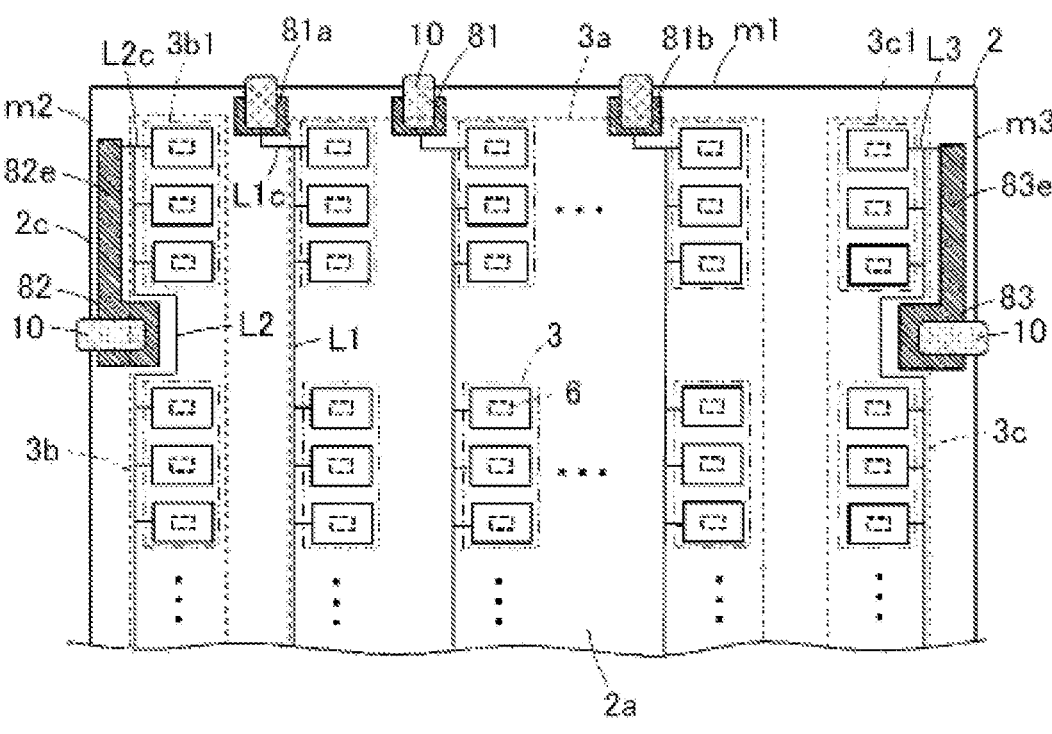
FIG. 7 is a partial plan view of a variation of the display device in FIG. 2, illustrating wiring in its main part.

As illustrated in FIG. 7, a display device 1b may include the second connection pad 82 larger than the first connection pad 81. In this structure, the length L2c of the connection section connecting the second connection pad 82 on the second emission control signal line L2 to the pixel unit 3b1 nearest the second connection pad 82 can be reduced further to a length approximate to the length L1c. The length L1c and the length L2c may also be substantially equal to each other. In this structure, the length of the second emission control signal line L2 is further approximate to the length of the first emission control signal line L1, and the resistance of the second emission control signal line L2 is further approximate to the resistance of the first emission control signal line L1. This can further reduce any mismatch in the current value and the voltage level between the emission control signal transmitted through the first emission control signal line L1 and the emission control signal transmitted through the second emission control signal line L2 in response to the same emission control signal input into the first emission control signal line L1 and the second emission control signal line L2. The display device 1b thus effectively provides higher display performance.

To produce the above effects, the second connection pad 82 may have a length in a direction along the second side m2 larger than the length of each first connection pad 81 in a direction along the first side m1. Further, as illustrated in FIG. 7, the second connection pad 82 may include an extension extending to a corner between the first side m1 and the second side m2. In other words, the second connection pad 82 may have an extension 82e extending along the second side m2 toward the first side m1. The extension 82e may have a smaller width than a main portion of the second connection pad 82. In this structure, the width of the frame portion along the second side m2 is less likely to be larger.

Figure 3:
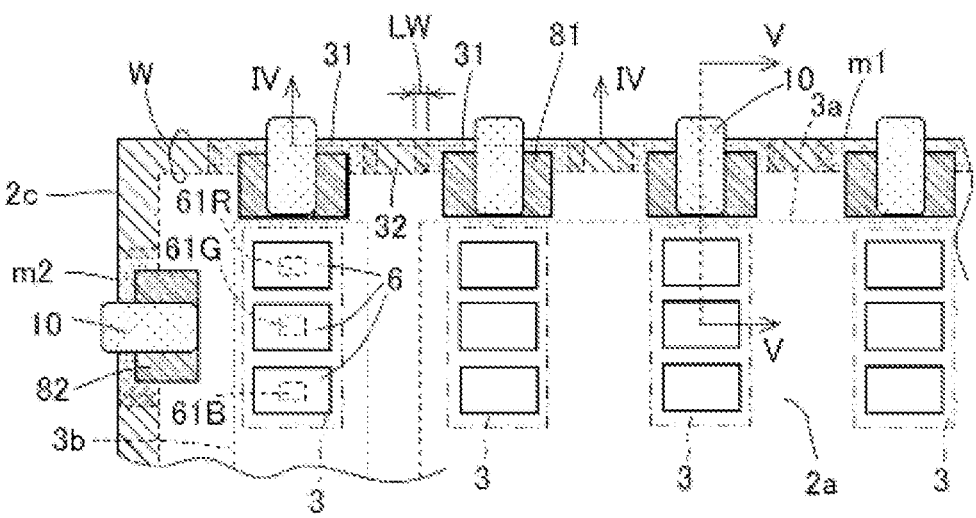
FIG. 3 is a partial plan view of the display device in FIG. 1, illustrating its main part.

In the display device 1a, as illustrated in FIG. 3, the substrate 2 may include the first surface 2a on which the multiple light emitters 6 are located, the second surface 2b (illustrated in FIG. 4) opposite to the first surface 2a, the side surface 2c connecting the first surface 2a and the second surface 2b, and the side wire 10 extending from the edge of the first surface 2a through the side surface 2c to the edge of the second surface 2b. The first connection pads 81 and the second connection pad 82 may be connected to the side wire 10. In this structure, the drive can be placed on the second surface 2b of the substrate 2, and the side wire 10 can electrically connect the pixel units 3 and the drive. The drive that may be in the frame portion in a known structure can be located on the second surface 2b. This structure may include a frame portion with a smaller size.

Figure 2:
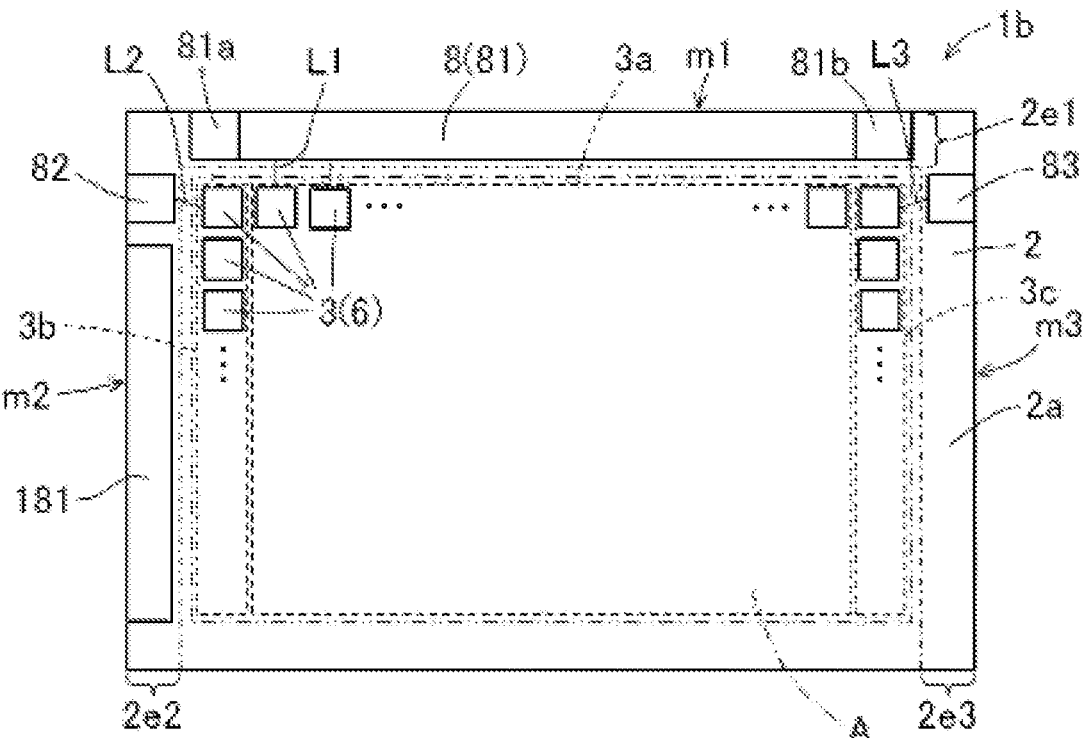
FIG. 2 is a schematic plan view of a display device according to another embodiment of the present disclosure.

FIG. 2 is a schematic plan view of a display device 1b according to another embodiment. The same reference numerals denote the components corresponding to those in the above embodiment. In the present embodiment, the display device 1b being self-luminous has the structure described below. The substrate 2 may include a third side m3 adjoining the first side m1 and opposite to the second side m2, and a third connection pad 83 located at the edge 2e3 adjacent to the third side m3 of the substrate 2 and connected to a third emission control signal line L3 for controlling the emission or non-emission state of the light emitters 6 in a third group 3c of the multiple light emitters 6. In this structure, the multiple first connection pads 81 as the majority of the multiple connection pads 8 are spaced from one another at the edge 2e1 at the distance to reduce short-circuiting between them, and the second connection pad 82 as the remaining one of the multiple connection pads 8 that cannot be at the edge 2e1 can be placed at the edge 2e2, and the third connection pad 83 as the remaining one of the multiple connection pads 8 that cannot be at the edge 2e1 can be placed at the edge 2e3. Thus, the multiple connection pads 8 are arranged on the substrate 2 without the frame portion being larger, and are less likely to have short-circuiting between the connection pads 8. The light emitters 6 in the third group 3c may be the light emitters 6 included in a group of the pixel units 3 in an array nearest the third side m3 in the multiple pixel units 3 arranged in a matrix. For the light emitters 6 in the third group 3c as the light emitters 6 included in a group of the pixel units 3 in two arrays nearest the third side m3 in the multiple pixel units 3 arranged in a matrix, for example, two third connection pads 83 may be placed, or three or more second connection pads 82 may be placed.

Figure 6:
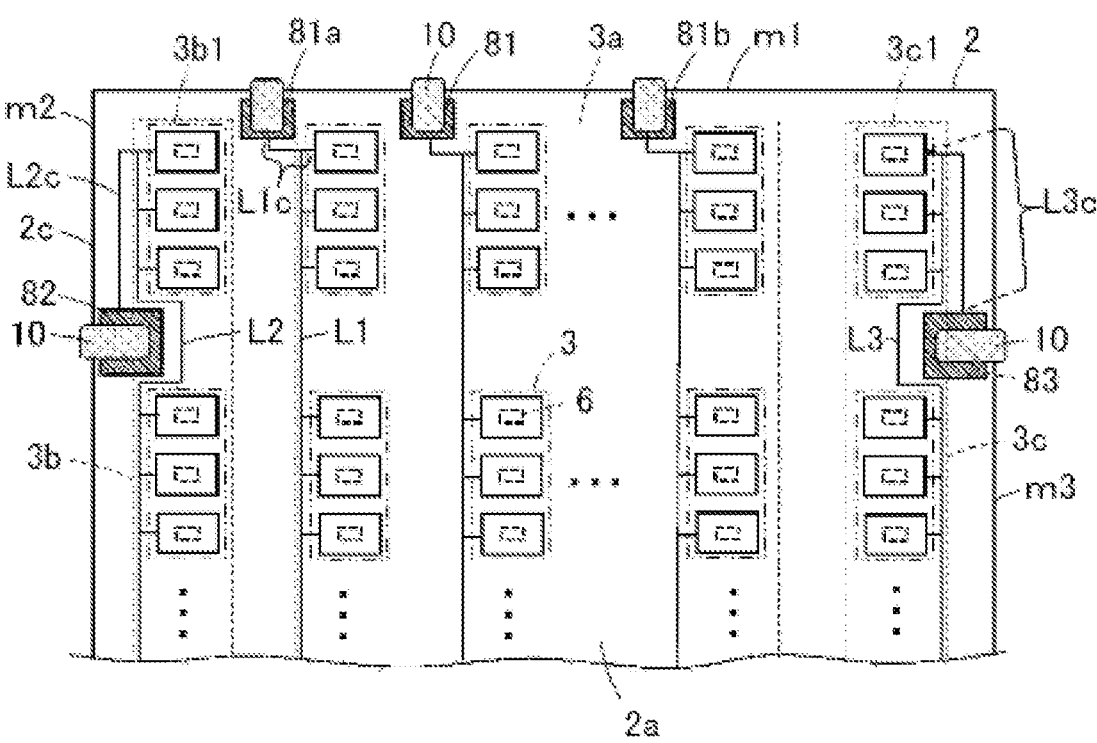
FIG. 6 is a partial plan view of the display device in FIG. 2, illustrating wiring in its main part.

As illustrated in FIG. 6, the display device 1b may include another connection pad located at the edge 2e3 adjacent to the third side m3 of the substrate 2 and connected to a wire other than the third emission control signal line L3. The third connection pad 83 may be located closer to the first side m1 than the other connection pad. In this structure, the length (length L3c) of a connection section connecting the third connection pad 83 on the third emission control signal line L3 to a pixel unit 3c1 nearest the third connection pad 83 can be approximate to the length L1c. This structure minimizes a difference between the length L1c and the length L3c. In this structure, the length of the third emission control signal line L3 is substantially equal to the length of the first emission control signal line L1, and the resistance of the third emission control signal line L3 is substantially equal to the resistance of the first emission control signal line L1. This can reduce any mismatch in the current value and the voltage level between the emission control signal transmitted through the first emission control signal line L1 and the emission control signal transmitted through the third emission control signal line L3 in response to the same emission control signal input into the first emission control signal line L1 and the third emission control signal line L3. The display device 1b thus effectively provides higher display performance. Additionally, the structure including the third connection pad 83 can reduce decreased flexibility in the layout of various wires on the second surface 2b of the substrate 2. This structure facilitates the layout of various wires on the second surface 2b of the substrate 2.

The third connection pad 83 may adjoin a first connection pad 81b located nearest the third side m3 in the multiple first connection pads 81. This structure increases the above effects.

The other connection pad described above may be a power supply connection pad connected to a power supply wire for supplying the power supply current to the light emitters 6, or a connection pad connected to the gate signal line 4.

As illustrated in FIG. 6, the display device 1b may include the light emitters 6 in the third group 3c located along the edge 2e3 adjacent to the third side m3. The third connection pad 83 may be located between the third groups 3c including the light emitters 6. In this structure, the third connection pad 83 can be located between the outermost pixel units 3 along the third side m3 of the substrate 2. The frame portion along the third side m3 can be further smaller.

As illustrated in FIG. 7, the display device 1b may include the third connection pad 83 larger than the first connection pad 81. In this structure, the length L3c of the connection section connecting the third connection pad 83 on the third emission control signal line L3 to the pixel unit 3c1 nearest the third connection pad 83 can be reduced further to a length approximate to the length L1c. The length L1c and the length L3c may also be substantially equal to each other. In this structure, the length of the third emission control signal line L3 is further approximate to the length of the first emission control signal line L1, and the resistance of the third emission control signal line L3 is further approximate to the resistance of the first emission control signal line L1. This can further reduce any mismatch in the current value and the voltage level between the emission control signal transmitted through the first emission control signal line L1 and the emission control signal transmitted through the third emission control signal line L3 in response to the same emission control signal input into the first emission control signal line L1 and the third emission control signal line L3.

To produce the above effects, the third connection pad 83 may have a length in a direction along the third side m3 larger than the length of each first connection pad 81 in the direction along the first side m1. Further, as illustrated in FIG. 7, the third connection pad 83 may include an extension extending to a corner between the first side m1 and the third side m3. In other words, the third connection pad 83 may have an extension 83e extending along the third side m3 toward the first side m1. The extension 83e may have a smaller width than a main portion of the third connection pad 83. In this structure, the width of the frame portion along the third side m3 is less likely to be larger.

Figure 12:
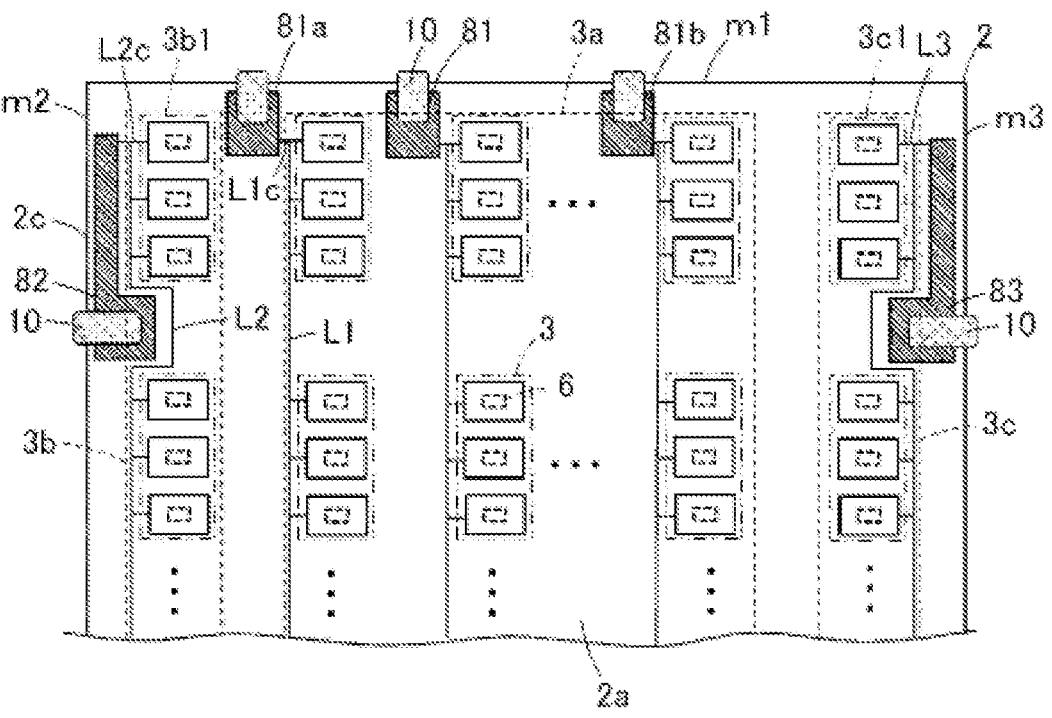
FIG. 12 is a partial plan view of a variation of the display device in FIG. 7, illustrating wiring in its main part.

FIG. 12 is a partial plan view of a variation of the display device in FIG. 7, illustrating wiring in its main part. Each first connection pad 81 may have a length in a direction orthogonal to the direction along the side m1 larger than its length in the direction along the first side m1. In this case, each first connection pad 81 is located closer to the pixel unit 3 (light emitter 6) nearest the first connection pad 81. The length L1c of the connection section connecting the first connection pad 81 to the nearest pixel unit 3 can be smaller. This reduces the length of a signal transmission path from the first connection pad 81 to the nearest pixel unit 3, and facilitates transmission of the signal from the first connection pad 81 to the nearest pixel unit 3. This also allows a conductive paste for forming the side wire 10 to flow in the depth direction of the first connection pad 81. This increases the contact area between the side wire 10 and the first connection pad 81 to reduce contact resistance. Each first connection pads 81 may have a shape having the longitudinal and lateral direction, such as a rectangle, a strip, an oval, or an ellipse. Each first connection pad 81 may have the length in the direction orthogonal to the direction along the first side m1 larger than one time and less than or equal to three times its length in the direction along the first side m1, but may have a length in another range of values. The structure of the first connection pad 81 illustrated in FIG. 12 may be used for the display devices illustrated in FIGS. 3, 5, and 6.

Figure 13:
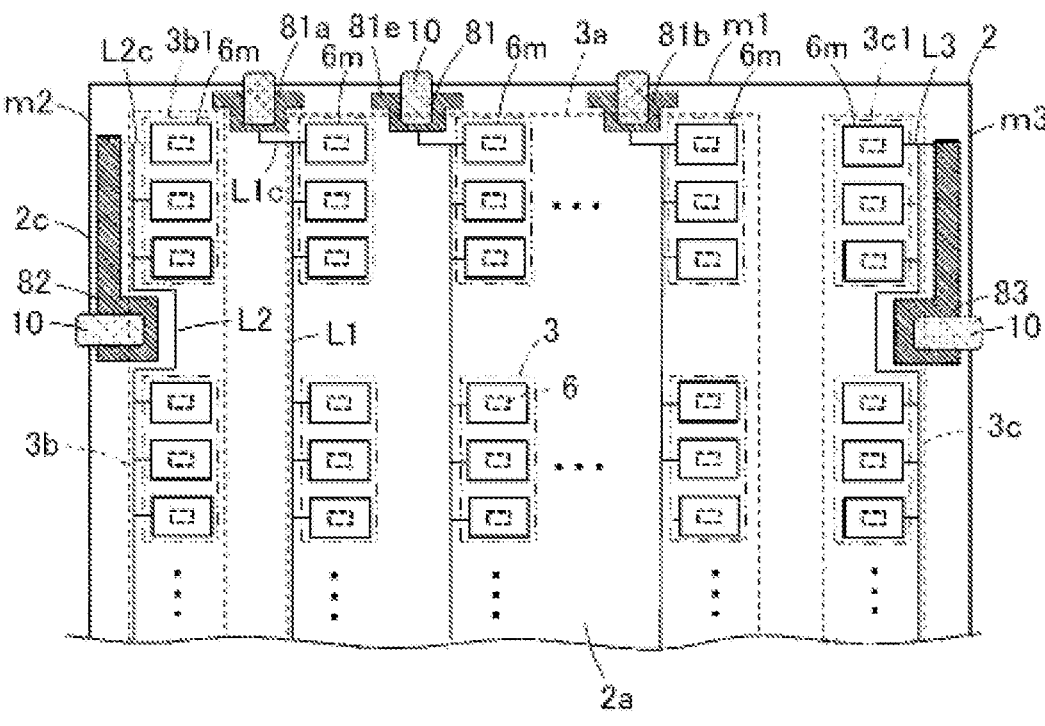
FIG. 13 is a partial plan view of a variation of the display device in FIG. 7, illustrating wiring in its main part.

FIG. 13 is a partial plan view of a variation of the display device in FIG. 7, illustrating wiring in its main part. Each first connection pad 81 may have a length adjacent to the first side m1 (e.g., the length of a side) larger than its length opposite to the first side m1 (e.g., the length of another side). More specifically, each first connection pad 81 may include, at its end adjacent to the first side m1, an extension 81e extending in the direction along the first side m1. This allows a conductive paste for forming the side wire 10 to effectively flow into the first connection pad 81 and to easily flow in the depth direction of the first connection pad 81. The contact area between the side wire 10 and the first connection pad 81 thus increases to reduce the contact resistance between them. The extension 81e can be located (in a frame portion) between each outermost light emitter 6m and an end of the substrate 2. The outermost light emitters 6m are located along the first side m1 of the substrate 2 at the edge 2e1 adjacent to the first side m1. With this structure, the conductive paste is less likely to extend to the outermost light emitters 6m. Each first connection pad 81 may have another shape such as a trapezoid. Each first connection pad 81 may have a length adjacent to the first side m1 larger than one time and less than or equal to three times its length opposite to the first side m1, but may have a length in another range of values. The structure of the first connection pad 81 illustrated in FIG. 13 may be used for the display devices illustrated in FIGS. 3, 5, and 6.

The first connection pad 81 may have the structure of FIG. 12 combined with the structure of FIG. 13.

In the display device 1b, as illustrated in FIG. 2, the substrate 2 may include the first surface 2a on which the multiple light emitters 6 are located, the second surface 2b opposite to the first surface 2a, the side surface 2c connecting the first surface 2a and the second surface 2b, and the side wire 10 extending from the edge of the first surface 2a through the side surface 2c to the edge of the second surface 2b. The third connection pad 83 may be connected to the side wire 10. In this structure, the drive can be placed on the second surface 2b of the substrate 2, and the side wire 10 can electrically connect the pixel units 3 and the drive. The drive that may be in the frame portion in a known structure can be located on the second surface 2b. This structure may include a frame portion with a smaller size.

The drive may be, for example, a drive element, such as an IC or an LSI circuit, mounted on the second surface 2b of the substrate 2 by, for example, a chip on glass (COG) method. The drive may also be a thin film circuit including a TFT including a semiconductor layer of low-temperature polycrystalline silicon (LTPS) formed on the second surface 2b of the substrate 2 by a thin film deposition technique such as chemical vapor deposition (CVD). The drive may also be a drive element on a flexible wiring board connected to an external connection terminal located on the second surface 2b of the substrate 2. Further, the drive may also be an external drive element electrically connected to wires on the flexible wiring board.

As illustrated in FIGS. 1 and 2, the display devices 1a and 1b may each include a power supply connection pad 181 located at the edge 2e2 adjacent to the second side m2 and connected to a power supply wire for supplying a power supply current to the multiple light emitters 6. This structure allows the group of connection pads 8 and the group of power supply connection pads 181 to be placed along different sides, and thus simplifies the wiring and may include a frame portion with a smaller size.

In the display devices 1a and 1b, each of the multiple pixel units 3 may include, as the light emitter, a rectangular micro-LED having a side length of 1 to 100 μm inclusive in a plan view. This structure provides higher definition.

In one or more embodiments of the present disclosure, a composite display device includes multiple display devices 1a (1b) joined to one another on side surfaces of the multiple display devices 1a (1b). The multiple display devices 1a (1b) may include a first display device 1a (1b) and a second display device 1a (1b) having the same structure. The first display device 1a (1b) includes a first side surface adjoining a first side m1 of the first display device 1a (1b). The second display device 1a (1b) includes a second side surface facing the first side surface. The first side surface of the first display device 1a (1b) and the second surface of the second display device 1a (1b) are joined to each other. The display device 1a (1b) may be the display device 1a or the display device 1b. The composite display device with the above structure produces the effects described below. The multiple connection pads 8 are located to cause less short-circuiting between them and thus have higher reliability. The display device 1a (1b) includes a frame portion with a smaller size that is less noticeable. The display device 1a (1b) provides higher display performance.

In one or more embodiments of the present disclosure, the display device has a specific structure described below. FIG.

Figure 4:
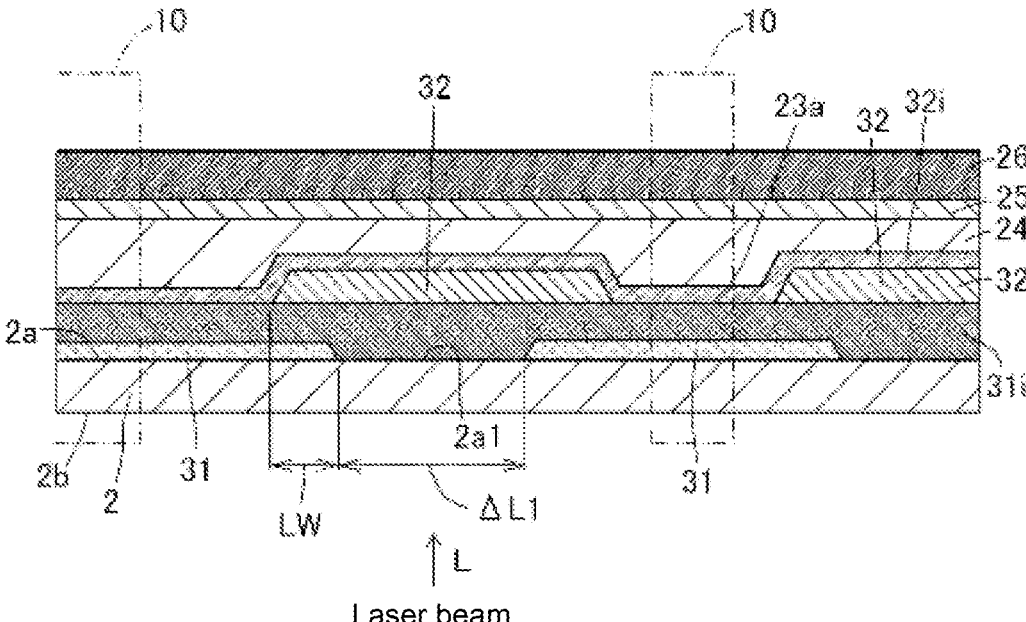
FIG. 4 is a cross-sectional view of the display device taken along section line IV-IV in FIG. 3.
Figure 8:
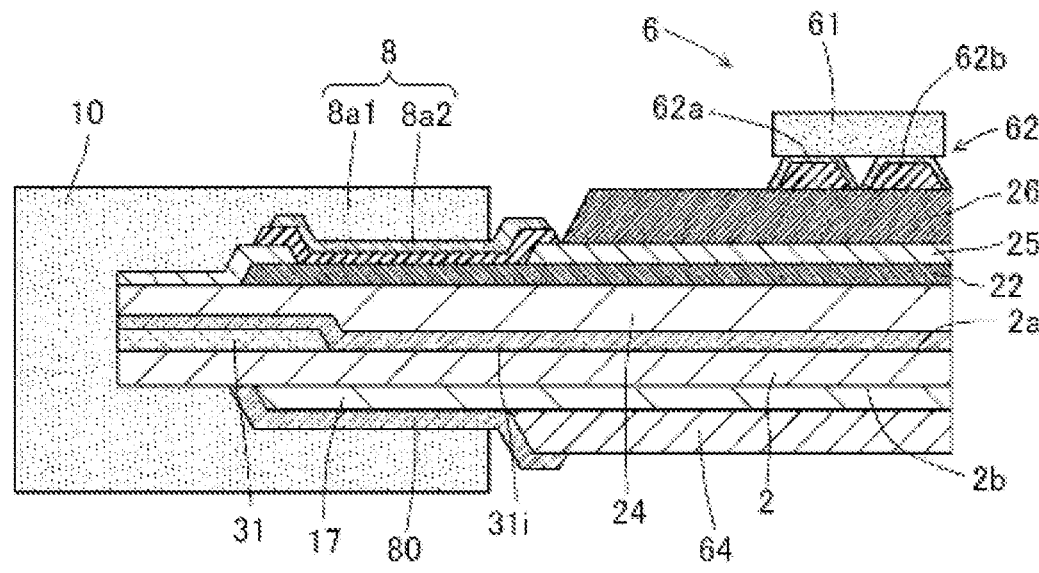
FIG. 8 is a cross-sectional view of the display device taken along section line V-V in FIG. 3.

3 is a schematic partial plan view of the display device 1a in FIG. 1, illustrating its main part. FIG. 4 is a cross-sectional view of the display device 1a taken along section line IV-IV in FIG. 3. FIG. 8 is a cross-sectional view of the display device 1a taken along section line V-V in FIG. 3. FIG. 5 is a partial plan view of the display device 1a in FIG. 1, illustrating wiring in its main part. FIG. 6 is a partial plan view of the display device 1b in FIG. 2, illustrating wiring in its main part. FIG. 7 is a partial plan view of a variation of the display device 1b in FIG. 2, illustrating wiring in its main part. To simplify the drawings, the circuitry on the second surface 2b of the substrate 2 is not illustrated in FIGS. 4 and 8.

In the present embodiment, the display devices 1a and 1b may include, for example, multiple substrates for tiling that are cut from a mother substrate with a laser beam applied on the back surface of the mother substrate. The substrates each include a smaller frame portion and multiple light-shielding metal layers. In this case, the laser beam used for cutting the multiple substrates from the mother substrate may be, for example, a high-power $CO_2$ laser or a YAG laser. A laser beam L (illustrated in FIG. 4) has a beam diameter of about 5 μm to 5 mm. The display devices 1a and 1b are hereafter collectively referred to as a display device 1.

The display device 1 including the multiple light-shielding metal layers has the structure described in detail below. The display device 1 includes the substrate 2, a first light-shielding metal layer 31 stacked on an edge W adjacent to one side of the first surface 2a of the substrate 2, a first insulating layer 31i stacked on the first light-shielding metal layer 31 and on an area 2a1 exposed from the first light-shielding metal layer 31 on the first surface 2a, a second light-shielding metal layer 32 stacked on the area 2a1 that does not overlap the first light-shielding metal layer 31 on the first insulating layers 31i, and a second insulating layer 32i stacked on the second light-shielding metal layer 32 and on an area 23a that overlaps the first light-shielding metal layer 31 on the first insulating layers 31i.

The above structure includes the first light-shielding metal layer 31, and includes, above the first light-shielding metal layer 31, the second light-shielding metal layer 32 located in the area 2a1 that does not overlap the first light-shielding metal layer 31. Thus, when the mother substrate is cut into segments with the laser beam applied on the back surface of the mother substrate in fabricating a tiling panel, the laser beam is less likely to thermally damage a portion of the insulating layers (particularly the second insulating layer 32i) irradiated with the laser beam. This structure reduces the likelihood of the applied laser beam causing sublimated substances from the insulating layers to adhere to, for example, the surrounding wires. Further, this structure reduces short-circuiting between the connection pads 8, to which different signals are transmitted from the side wiring 10 through an exposed end face of the first light-shielding metal layer 31, although the laser beam is applied at varying cutting positions. The light-shielding metal layer is divided into the first light-shielding metal layer 31 and the second light-shielding metal layer 32 that are thus less likely to have electrostatic discharge.

The display device 1 may include the pixel units 3 arranged in a matrix on the first surface 2a of the substrate 2, a power supply circuit 7 located on the second surface 2b of the substrate 2, the multiple first connection pads 81, each located near the edge W of the first surface 2a of the substrate 2 and electrically connected to the side wire 10, multiple seventh connection pads 80, each located near an edge W of the second surface (back surface) 2b of the substrate 2 and electrically connected to the side wire 10, and multiple side wires 10. Each of the first light-shielding metal layer 31 and the second light-shielding metal layer 32 has a width of, for example, about 50 to 200 μm.

The display device 1 further includes multiple first light-shielding metal layers 31 stacked on the edge W adjacent to the first side m1 of the first surface 2a of the substrate 2, each spaced at a distance ΔL1 from another in a direction in which the first side m1 extends, the first insulating layer 31i stacked on the multiple first light-shielding metal layers 31 and on the area 2a1 exposed between adjoining two of the multiple first light-shielding metal layers 31 on the first surface 2a, multiple second light-shielding metal layers 32 stacked on the area 2a1 on the first insulating layer 31i between the adjoining two of the multiple first light-shielding metal layers 31 in the direction in which the first side m1 extends in a plan view, and the second insulating layer 32i stacked on the multiple second light-shielding metal layers 32 and on the area 23a exposed between adjoining two of the multiple second light-shielding metal layers 32 on the first insulating layers 31i in a plan view.

The first light-shielding metal layers 31 and the second light-shielding metal layers 32 to shield the laser beam L may be made of aluminum, chromium, molybdenum, or an alloy of these metals. Each of the first light-shielding metal layers 31 and the second light-shielding metal layers 32 may include a single layer or may include multiple layers stacked on one another. When the first light-shielding metal layers 31 and the second light-shielding metal layers 32 are made of aluminum having higher reflectivity, a transparent insulating layer may be placed on a portion irradiated with the laser beam L on each of the first light-shielding metal layers 31 and the second light-shielding metal layers 32. In this case, the first light-shielding metal layers 31 and the second light-shielding metal layers 32 reflect the laser beam L without decreasing the reflectivity, and the transparent insulating layer reduces thermal absorption. This allows the laser beam L to be efficiently reflected outside the second surface 2b of the substrate 2 and the thermal absorption to be reduced. This structure effectively reduces thermal damage to, for example, the second insulating layer 32i and organic insulating layers 24 and 26.

The first light-shielding metal layers 31 and the second light-shielding metal layers 32 may be made of, for example, molybdenum. The molybdenum layers efficiently absorb a laser beam and transfer heat from the laser beam and thus are likely to reduce the intensity of reflected light and are less likely to increase the temperature of the display device 1. In other words, this structure more effectively reduces thermal damage caused by secondary reflection and absorption of light reflected from first light-shielding metal layers 31 and the second light-shielding metal layers 32.

The first light-shielding metal layers 31 and the second light-shielding metal layers 32 may include, for example, layers of Mo/Al/Mo or MoNd/AlNd/MoNd. The stack of Mo/Al/Mo includes a Mo layer, an Al layer, and a Mo layer in this order. MoNd is an alloy of Mo and Nd.

The first light-shielding metal layers 31 and the second light-shielding metal layers 32 may be made of chromium oxide having a black color. In other words, these layers may absorb and attenuate the laser beam L.

As illustrated in FIG. 3, the display device 1 may include the multiple first light-shielding metal layers 31 stacked on the edge W at a distance from one another in a direction parallel to one side (e.g., the first side m1), and the second light-shielding metal layer 32 stacked on the area 2a1 between adjoining two of the first light-shielding metal layers 31 on the first insulating layer 31i. The area 2a1 does not overlap the first light-shielding metal layers 31. In this case, the first light-shielding metal layers 31 and the second light-shielding metal layers 32 are further divided into smaller areas, and are thus less likely to have electrostatic discharge.

The first light-shielding metal layers 31 and the second light-shielding metal layers 32 may be continuous with each other in a plan view. In this case, light (laser beam) incident through the second surface 2b of the substrate 2 is less likely to reach the second insulating layer 32i. This more effectively reduces thermal damage caused by the laser beam to the second insulating layer 32i.

Each second light-shielding metal layer 32 may include an overlapping portion LW that overlaps the corresponding first light-shielding metal layer 31 in a plan view. In this case, light (laser beam) incident through the second surface 2b of the substrate 2 is further less likely to reach the second insulating layer 32i. This more effectively reduces thermal damage caused by the laser beam to the second insulating layer 32i. The overlapping portion LW may have a length of about 5 to 500 μm.

The overlapping portion LW may also have a length to prevent diffracted light, which is light (laser beam) incident through the second surface 2b of the substrate 2 and diffracted at the end of the first light-shielding metal layer 31, from reaching the second insulating layer 32i. This structure also has the same effects as described above. In this structure, the overlapping portion LW has a length of about 20 to 700 μm.

The first light-shielding metal layers 31 and the second light-shielding metal layers 32 may have light reflectivity. In this case, the first light-shielding metal layers 31 and the second light-shielding metal layers 32 reflect light (laser beam) incident through the second surface 2b of the substrate 2. This structure more effectively reduces thermal damage caused by the laser beam to the second insulating layer 32i. The first light-shielding metal layers 31 and the second light-shielding metal layers 32 may be made of, for example, a metal material or an alloy material having higher light reflectivity of visible light. Examples of the metal material include aluminum (Al), silver (Ag), gold (Au), chromium (Cr), nickel (Ni), platinum (Pt), and tin (Sn). Examples of the alloy material include duralumin, which is an aluminum alloy mainly containing aluminum (an Al—Cu alloy, an Al—Cu—Mg alloy, or an Al—Zn—Mg—Cu alloy). These materials have a light reflectance of about 90 to 95% for aluminum, about 93% for silver, about 60 to 70% for gold, about 60 to 70% for chromium, about 60 to 70% for nickel, about 60 to 70% for platinum, about 60 to 70% for tin, and about 80 to 85% for an aluminum alloy. Thus, the first light-shielding metal layers 31 and the second light-shielding metal layers 32, each having light reflectivity, may be made of, for example, aluminum, silver, gold, or an aluminum alloy.

The first light-shielding metal layers 31 and the second light-shielding metal layers 32 may have light scattering characteristics. In this case, the arithmetic mean roughness that allows the surface of a thin film and the surface of a substrate to be an optical mirror surface is typically about one tenth of the wavelength being used. Thus, with light having a wavelength of 550 nm that has the highest sensitivity to human eyes, a surface with an arithmetic mean roughness of not more than 55 nm is likely to be an optical mirror surface. A surface with an arithmetic mean roughness of 55 nm or greater is likely to be a light scattering surface. Thus, each of the first light-shielding metal layers 31 and the second light-shielding metal layers 32 having the light scattering characteristics may have a surface with an arithmetic mean roughness of about 55 nm to 10 μm. The arithmetic mean roughness may be specifically about 1 to 10 μm, or more specifically about 2 to 7 μm.

The first insulating layer 31i may contain light scattering particles. In this case, the light scattering particles contained in the first insulating layer 31i scatter light (laser beam) incident through the second surface 2b of the substrate 2 to effectively reduce thermal damage caused by the laser beam to the second insulating layer 32i. The light scattering particles are, for example, made of a metal material, an alloy material, a glass material, a ceramic material, or a metal oxide material. Examples of the metal material include aluminum (Al), silver (Ag), gold (Au), chromium (Cr), nickel (Ni), platinum (Pt), and tin (Sn). Examples of the alloy material include duralumin, which is an aluminum alloy mainly containing aluminum (an Al—Cu alloy, an Al—Cu—Mg alloy, or an Al—Zn—Mg—Cu alloy). Examples of the glass material include borosilicate glass, crystallized glass, quartz, and soda glass. Examples of the ceramic material include alumina, aluminum nitride, and silicon nitride. Examples of the metal oxide material include titanium oxide. The light scattering particles of, for example, a transparent material such as the glass material or the metal oxide material scatter and refract the laser beam incident through the second surface 2b of the substrate 2 to reduce the likelihood of the laser beam reaching the second insulating layer 32i. The light scattering particles of, for example, a metal material or an alloy material having light reflectivity such as metallic luster reflect and scatter the laser beam incident through the second surface 2b of the substrate 2 to reduce the likelihood of the laser beam reaching the second insulating layer 32i.

The light scattering particles may have a mean particle size of about 55 nm to 10 μm. The light scattering particles may have a mean particle size of specifically about 1 to 10 μm, or more specifically about 2 to 7 μm.

The first insulating layer 31i may be made of an inorganic material of, for example, silicon oxide ($SiO_2$) or silicon nitride ($Si_3N_4$). This improves the laser resistance of the first insulating layer 31i, on which the laser beam through the second surface 2b of the substrate 2 is incident before being incident on the second insulating layer 32i.

The second insulating layer 32i may be made of an organic material such as an acrylic resin or a polycarbonate resin. In this case, the second insulating layer 32i, which is less susceptible to thermal damage caused by the laser beam incident through the second surface 2b of the substrate 2, can be, for example, a flat layer with a larger thickness.

The second insulating layer 32i may be a light-shielding layer including, for example, a black resin or typically a black matrix. In this case, when the display device 1 is used as a display device, the light-shielding layer provides a black background color and improves the contrast of the display image.

The side wire 10 on the substrate 2 may extend from the edge W of the first surface 2a through the side surface 2c to the second surface 2b. The side wire 10 may overlap at least one of the first light-shielding metal layer 31 or the second light-shielding metal layer 32. In this case, the side wires 10 adjoining each other are less likely to cause short-circuiting between them through at least one of the exposed area of the first light-shielding metal layer 31 or the expose are of the second light-shielding metal layers 32. The side wire 10 may include a conductive paste containing conductive particles of, for example, Ag, Cu, Al, or stainless steel, an uncured resin component, an alcohol solvent, and water. The conductive paste may be applied to an intended area from the first surface 2a of the substrate 2 to the side surface 2c and to the second surface 2b and cured by heating, photocuring using ultraviolet ray irradiation, or a combination of photocuring and heating. The side wire 10 may be formed by a thin film deposition technique, such as plating, vapor deposition, or CVD. The substrate 2 may include a groove formed in advance for the side wire 10 in areas of the first surface 2a, the side surface 2c, and the second surface 2b. This allows a conductive paste for forming the side wire 10 to easily flow in the intended area on the substrate 2.

The first light-shielding metal layers 31 and the second light-shielding metal layers 32 may be electrically floating (in an electrically floating state). In other words, each of the first light-shielding metal layers 31 and the second light-shielding metal layers 32 may remain unconnected to a specific potential, such as an anode potential or a cathode potential. This structure generates a potential gradient from a portion connected to the specific potential to an end opposite to the portion in each of the first light-shielding metal layers 31 and the second light-shielding metal layers 32. The potential gradient prevents the first light-shielding metal layers 31 and the second light-shielding metal layers 32 from being degraded by electric corrosion.

The first light-shielding metal layers 31 and the second light-shielding metal layers 32 may be arranged across the periphery of the substrate 2. For example, when the substrate 2 is rectangular and includes all the four sides to be cut with a laser beam, the first light-shielding metal layers 31 and the second light-shielding metal layers 32 may be placed on all these four sides. When the substrate 2 includes the sides to be cut with a laser beam and the sides not to be cut with a laser beam, the first light-shielding metal layers 31 and the second light-shielding metal layers 32 may be placed at least on the sides to be cut with a laser beam.

The first insulating layer 31i is made of an inorganic material. The second insulating layer 32i is made of an organic material. The light emitters 6, a TFT to drive and control each of the light emitters 6, and a wiring layer connecting each of the light emitters 6 with the TFT, such as the gate signal line 4 or a source signal line 5 (described later), may be located on the first surface 2a of the substrate 2. At least one of the first light-shielding metal layer 31 or the second light-shielding metal layer 32 may be made of the same material as the wiring layer. In this case, the number of processes can be reduced.

Figure 9:
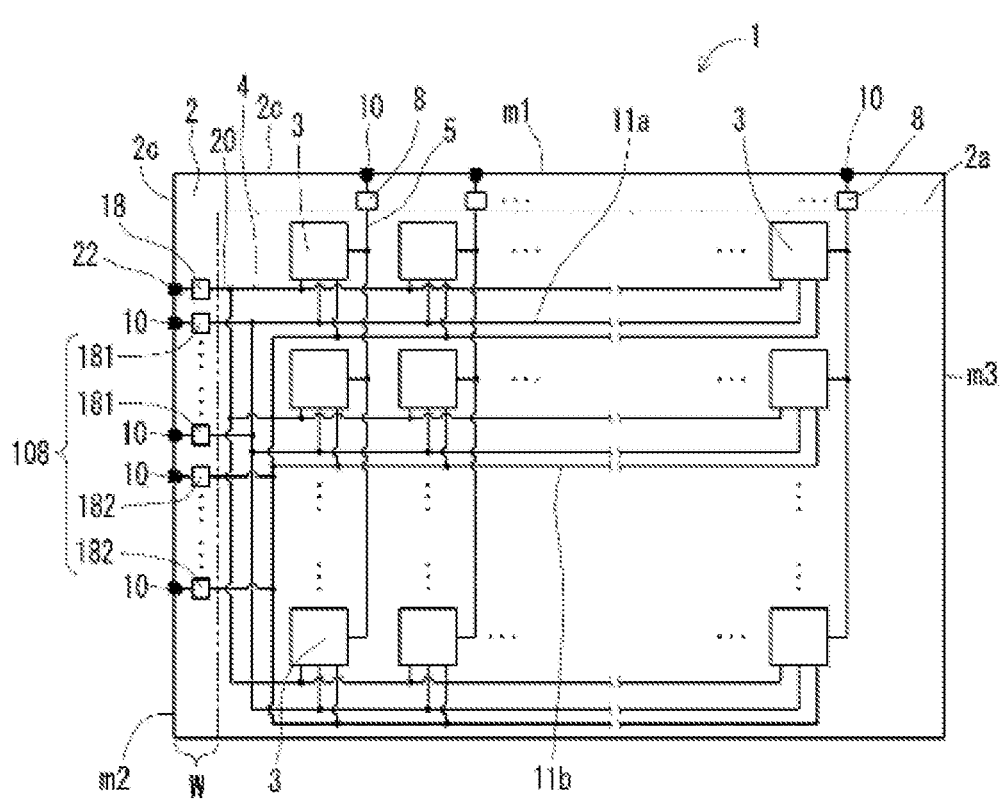
FIG. 9 is a schematic block circuit diagram of the display device in FIG. 1, illustrating circuitry on its first surface.
Figure 10:
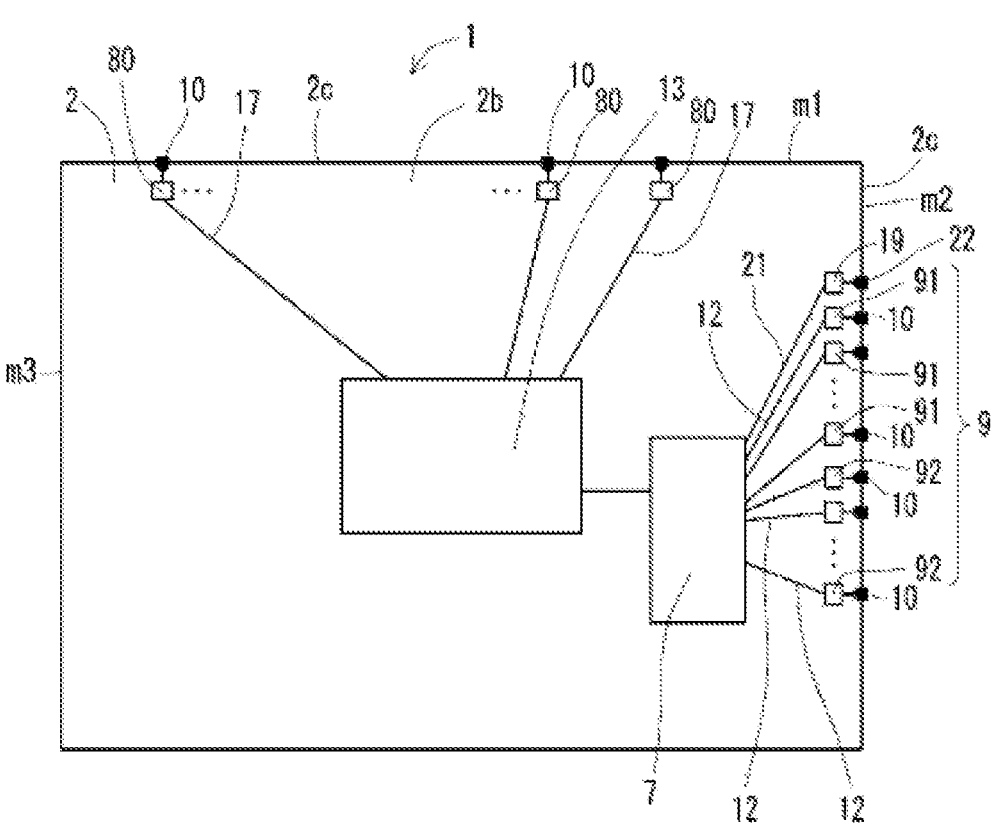
FIG. 10 is a schematic block circuit diagram of the display device in FIG. 1, illustrating circuitry on its second surface.

FIG. 9 is a schematic block circuit diagram of the display device in FIG. 1, illustrating circuitry on the first surface 2a. FIG. 10 is a schematic block circuit diagram of the display device in FIG. 1, illustrating circuitry on the second surface 2b. The substrate 2 is, for example, a transparent or opaque glass substrate, a plastic substrate, or a ceramic substrate. The substrate 2 includes a third surface (side surface) 2c connecting the first surface 2a and the second surface 2b. The substrate 2 may include at least the first side m1 and the second side m2 adjoining the first side m1. The substrate 2 may be, for example, a triangular plate, a rectangular plate, a parallelogram plate, a trapezoidal plate, a hexagonal plate, or a plate with any other shape. The substrate 2 being, for example, a triangular plate, a rectangular plate, or a hexagonal plate, allows easy tiling of multiple display devices 1 into a composite large display device (hereafter also referred to as a multi-display). In the present embodiment, as illustrated in, for example, FIGS. 1 and 2, the substrate 2 is a rectangular plate. The substrate 2 may include the third side m3 adjoining the first side m1 and opposite to the second side m2. In this case, the substrate 2 may be, for example, a rectangular plate, a parallelogram plate, a trapezoidal plate, a hexagonal plate, or a plate with any other shape. The second side m2 and the third side m3 opposite to the second side m2 may be parallel to each other, but may not be precisely parallel to each other.

The multiple pixel units 3 are arranged in a matrix with a predetermined pitch from one another on the first surface 2a of the substrate 2. The pixel units 3 are arranged at intersections of the gate signal lines 4 and the source signal lines 5. Each pixel unit 3 includes the light emitter 6. The multiple gate signal lines 4 extend in a predetermined direction (in the lateral direction, or in the row direction in FIG. 9). The multiple source signal lines 5 extend to intersect with the multiple gate signal lines 4 in a direction (e.g., the column direction) intersecting with the predetermined direction. The pixel units 3 are arranged at intersections of the gate signal lines 4 and the source signal lines 5. As illustrated in, for example, FIG. 9, the pixel units 3 are arranged in a matrix at a predetermined pixel pitch.

Each pixel unit 3 includes the light emitter 6 and an electrode pad 62. The light emitter 6 is, for example, a self-luminous light emitter such as an LED, an organic electroluminescent element, or a semiconductor laser element. In the present embodiment, the light emitter 6 is an LED. The light emitter 6 may also be a micro-LED. The light emitter 6 being a micro-LED, located on the first surface 2a, may be rectangular in a plan view with each side having a length of about 1 to 100 μm inclusive or about 3 to 10 μm inclusive.

The light emitter 6 includes an anode terminal and a cathode terminal. The electrode pad 62 includes an anode pad 62a and a cathode pad 62b. The anode terminal and the cathode terminal of the light emitter 6 are electrically connected to the anode pad 62a and the cathode pad 62b with a conductive bond, such as a conductive adhesive or solder.

Each pixel unit 3 may include multiple light emitters 6, multiple anode pads 62a, and a single cathode pad 62b or multiple cathode pads 62b. The anode pads 62a are electrically connected to the anode terminals of the light emitters 6. The single or multiple cathode pads 62b are electrically connected to the multiple cathode terminals of the multiple light emitters 6. For the single cathode pad 62b, the light emitters 6 may be commonly connected to the cathode pad 62b. The light emitters 6 may include a light emitter 61R that emits red light, a light emitter 61G that emits green light, and a light emitter 61B that emits blue light. In this case, each pixel unit 3 enables display of color tones. Each pixel unit 3 may include a light emitter that emits orange, red-orange, red-violet, or violet light in place of the light emitter 61R that emits red light. Each pixel unit 3 may include a light emitter that emits yellow-green light in place of the light emitter 61G that emits green light.

As illustrated in, for example, FIG. 10, the power supply circuit 7 as a power feeder is located on the second surface 2b. The power supply circuit 7 generates a first power supply voltage VDD and a second power supply voltage VSS to be provided to the pixel units 3. The power supply circuit 7 includes a VDD terminal for outputting the first power supply voltage VDD and a VSS terminal for outputting the second power supply voltage VSS. The first power supply voltage VDD is an anode voltage of, for example, about 10 to 15 V. The second power supply voltage VSS is lower than the first power supply voltage VDD and is a cathode voltage of, for example, about 0 to 3 V. The power supply circuit 7 may be, for example, a flexible circuit board (FPC). The power feeder may be a circuit module including a semiconductor device such as an IC or an LSI circuit for power supply voltage control. The power feeder may further include, in addition to the power supply circuit 7, a control element including an IC chip to generate control signals to control the emission or non-emission state and the light intensity of the light emitters 6. The control unit may be a controller included in the power supply circuit 7.

A drive circuit 13 is located on the second surface 2*b*. The drive circuit 13 is electrically connected to the source signal line 5 located on the first surface 2*a* with a second source signal line 17 located on the second surface 2*b*. The drive circuit 13 and the power supply circuit 7 may be electrically connected to each other for synchronized operations.

As illustrated in, for example, FIG. 9, a power supply connection pad 108 is located at the edge W adjacent to the second side m2 of the first surface 2*a*. The edge W is a peripheral side edge along the second side m2 and has a width of about 10 to 500 μm from the second side m2 of the first surface 2*a* toward the center of the first surface 2*a* of the substrate 2. The edge W may have a width other than these values. The power supply connection pad 108 includes multiple first power supply connection pads 181 and multiple second power supply connection pads 182. The first power supply connection pads 181 are used to supply the first power supply voltage VDD to the pixel units 3. The second power supply connection pads 182 are used to supply the second power supply voltage VS S to the pixel units 3. The first power supply connection pads 181 and the second power supply connection pads 182 are each rectangular and have each side with a length of about 50 to 500 μm, or specifically about 70 to 300 μm, but may have a length other than these values. The first power supply connection pads 181 and the second power supply connection pads 182 may each have various shapes, such as a pentagon or other polygons, a trapezoid, a circle, or an oval. The wiring pads hereafter may have the same or similar structure as described above.

As illustrated in, for example, FIG. 9, the display device 1 includes first routing wires 11*a* and second routing wires 11*b*. The first routing wires 11*a* and the second routing wires 11*b* are located on the first surface 2*a*. The first routing wires 11*a* and the second routing wires 11*b* include layers of, for example, Mo/Al/Mo or MoNd/AlNd/MoNd. The stack of Mo/Al/Mo includes a Mo layer, an Al layer, and a Mo layer in this order. The same applies to other notations. The first routing wires 11*a* connect the anode terminals of the light emitters 6 to the first power supply connection pads 181. The second routing wires 11*b* connect the cathode terminals of the light emitters 6 to the second power supply connection pads 182.

The first routing wires 11*a* and the second routing wires 11*b* may be in planar wiring patterns. The first routing wires 11*a* and the second routing wires 11*b* may be electrically insulated from each other with an insulating layer (not illustrated) between them. The first routing wires 11*a* may include the anode pads 62*a* of the electrode pads 62 as parts of the first routing wires 11*a*.

As illustrated in FIG. 10, a power supply connection pad 9 is located on the second surface (back surface) 2*b*. The power supply connection pad 9 may be located at, for example, the edge adjacent to the second side m2. The edge may have the same or similar structure to the edge W described above. The power supply connection pad 9 includes multiple third power supply connection pads 91 and multiple fourth power supply connection pads 92. The third power supply connection pads 91 are used to supply the first power supply voltage VDD to the pixel units 3. The fourth power supply connection pads 92 are used to supply the second power supply voltage VSS to the pixel units 3.

The display device 1 includes as many first power supply connection pads 181 as the third power supply connection pads 91, and as many second power supply connection pads 182 as the fourth power supply connection pads 92. The first power supply connection pads 181 may overlap the respective third power supply connection pads 91 in a plan view, or in other words, as viewed in a direction orthogonal to the first surface 2*a*. The second power supply connection pads 182 may overlap the respective fourth power supply connection pads 92 in a plan view.

The display device 1 includes third routing wires 12. The third routing wires 12 are located on the second surface 2*b*. The third routing wires 12 include a layer of, for example, Mo/Al/Mo, MoNd/AlNd/MoNd, or Ag. As illustrated in, for example, FIG. 10, the third routing wires 12 connect the VDD terminal of the power supply circuit 7 to the third power supply connection pads 91, and connects the VSS terminal of the power supply circuit 7 to the fourth power supply connection pads 92.

The multiple side wires 10 extend from the first surface 2*a* through the third surface 2*c* being a side surface of the substrate 2 to the second surface 2*b*. In the present embodiment, as illustrated in, for example, FIG. 8, the side wires 10 extend from the first surface 2*a* to the third surface 2*c* and to the second surface 2*b*. The side wires 10 connect the first power supply connection pads 181 to the third power supply connection pads 91. The side wires 10 connect the second power supply connection pads 182 to the fourth power supply connection pads 92.

The display device 1 may include, instead of the side wires 10, multiple feedthrough conductors extending through the substrate 2 from the first surface 2*a* to the second surface 2*b*. The display device 1 may also include both the multiple feedthrough conductors and the multiple the side wires 10. In the present embodiment, the display device 1 may include at least the side wires 10.

The display device 1 includes gate wires extending from the first surface 2*a* to the second surface 2*b* and connecting the gate signal lines 4 to the controller in the power supply circuit 7. As illustrated in, for example, FIGS. 9 and 10, the gate wires include a fifth connection pad 18, a sixth connection pad 19, a first gate wire 20, a second gate wire 21, and a third gate wire 22. The third gate wire 22 serves as a side wire.

As illustrated in, for example, FIG. 9, the fifth connection pad 18 is located at the edge adjacent to the second side m2 of the first surface 2*a*. As illustrated in, for example, FIG. 10, the sixth connection pad 19 is located at the edge adjacent to the second side m2 of the second surface 2*b*. The fifth connection pad 18 may overlap the sixth connection pad 19 in a plan view. As illustrated in, for example, FIG. 9, the first gate wire 20 is located on the first surface 2*a* and connects the gate signal line 4 to the fifth connection pad 18. As illustrated in, for example, FIG. 10, the second gate wire 21 is located on the second surface 2*b* and connects the controller in the power supply circuit 7 to the sixth connection pad 19. As illustrated in, for example, FIGS. 9 and 10, the third gate wire 22 extends from the first surface 2*a* to the third surface 2*c* and to the second surface 2*b* and connects the fifth connection pad 18 to the sixth connection pad 19.

The connection pads 8 (e.g., the first connection pads 81) and the seventh connection pads 80 on the back surface corresponding to the connection pads 8 are made of a conductive material. The first connection pads 81 and the seventh connection pads 80 may each include a single metal layer, or multiple metal layers stacked on one another. The first connection pads 81 and the seventh connection pads 80 may include a layer of, for example, Al, Al/Ti, Ti/Al/Ti, Mo, Mo/Al/Mo, MoNd/AlNd/MoNd, Cu, Cr, Ni, or Ag.

As illustrated in FIG. 8, each connection pad 8 may include a conductor layer 8a1 and a conductor layer 8ba2 stacked on the conductor layer 8a1. The conductor layer 8a1 may include a layer of, for example, Al, Al/Ti, Ti/Al/Ti, Mo, Mo/Al/Mo, MoNd/AlNd/MoNd, Cu, Cr, Ni, or Ag. The conductor layer 8a2 on the conductor layer 8a1 may be a transparent conductive layer of, for example, indium tin oxide (ITO) or indium zinc oxide (IZO). The connection pad 8 may include insulating layers 25 and 26 at its inward end on the first surface 2a. This reduces short-circuiting between the connection pad 8 and a wiring conductor or another element located inward on the first surface 2a. The insulating layers 25 and 26 are made of, for example, $SiO_2$, $Si_3N_4$, or a polymeric material such as an acrylic resin. The seventh connection pad 80 may have its surface coated with a transparent conductive layer of, for example, ITO or IZO.

Each pixel unit 3 includes, on the substrate 2, a first TFT as a switch element for inputting an emission signal into each light emitter 6, and a second TFT as a drive element for driving each light emitter 6 with a current based on an electric potential difference (emission signal) between a positive voltage (anode voltage of about 10 to 15 V) and a negative voltage (cathode voltage of about 0 to 3 V) corresponding to a level (voltage) of an emission control signal (a signal transmitted through an image signal line SL).

Each of the first and second TFTs includes a semiconductor film of, for example, amorphous silicon (a-Si) or LTPS and three terminals that are a gate electrode, a source electrode, and a drain electrode. The first and second TFTs may both be n-channel TFTs or may both be p-channel TFTs. Either the first TFT or the second TFT may be an n-channel TFT, and the other TFT may be a p-channel TFT. The TFTs function as switch elements (gate transfer elements) by allowing a current to flow through the semiconductor film (channel) between the source electrode and the drain electrode in response to a voltage with a predetermined potential (about 2.5 to 3.5 V) applied to the gate electrode. With the substrate 2 being a glass substrate and the drive element being a drive circuit using a TFT including semiconductor films of LTPS, the TFT can be formed directly on the substrate 2 by a thin film deposition technique such as CVD.

Figure 14:
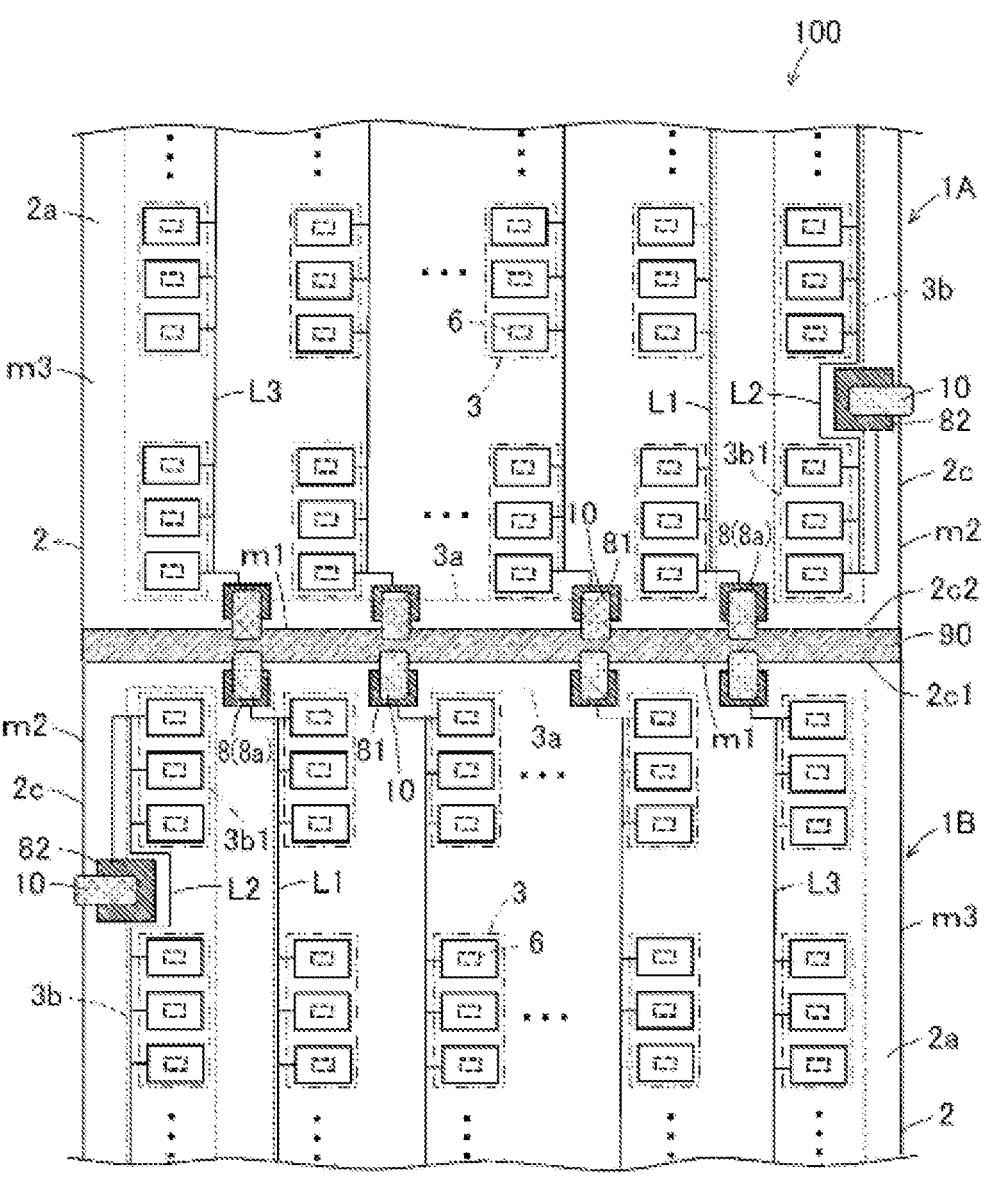
FIG. 14 is a partial plan view of a composite display device according to an embodiment of the present disclosure, illustrating its main part.

FIG. 14 is a partial plan view of a composite display device according to an embodiment of the present disclosure, illustrating its main part. As illustrated in FIG. 14, a composite display device 100 can include the multiple display devices 1 according to one or more embodiments of the present disclosure. The composite display device 100 includes multiple display devices 1 joined to one another on their side surfaces. The display devices 1 include a first display device 1A and a second display device 1B. The first display device 1A includes a first side surface 2c1 adjoining a first side m1 of the first display device 1A. The second display device 1B includes a second side surface 2c2 facing the first side surface 2c1. The first side surface 2c1 and the second side surface 2c2 are joined to each other. A joining member 90 for joining the first side surface 2c1 of the first display device 1A to the second side surface 2c2 of the second display device 1B may be a resin adhesive. Examples of the resin adhesive include a photocurable resin material or a thermosetting resin material, such as an epoxy resin, a polyamide resin, a mixture of an epoxy resin and a polyamide resin, an acrylic resin, a silicone resin, or a urethane resin. Examples of the resin adhesive may include a black resin material containing an inorganic black pigment mixed with a resin material. This allows the joint (tiled portion) between the first display device and the second display device to be less noticeable and thus achieves continuity of the display image at the joint. Examples of the inorganic pigment may include carbon pigments such as carbon black, nitride pigments such as titanium black, and metal oxide pigments such as Cr—Fe—Co, Cu—Co—Mn, Fe—Co—Mn, and Fe—Co—Ni—Cr pigments.

For the composite display device 100, three or more display devices 1 may be joined to one another. The composite display device 100 may include a base substrate. Multiple display devices 1 may be fixed on the base substrate with a fixing member. The fixing member may include a mechanical fastener such as a screw, a clip, or an engagement member, or a chemical fixing element such as an adhesive. The fixing member may include a frame into which the edge of the substrate 2 of the display device 1 is fitted. The frame may be fixed to the base substrate with a mechanical fastener or a chemical fixing element.

The joining member may be black and include an uneven surface for absorbing incident light. For example, the joining member may be made of a black resin formed by mixing a black pigment such as carbon black in a base material such as silicone resin, and may have unevenness with an arithmetic mean roughness of about 10 to 50 μm or specifically about 20 to 30 μm on the surface of the black resin by, for example, a transfer method. This structure greatly increases the light absorption of the joining member.

In the present embodiment, when the multiple display devices 1 are tiled to one another into the composite display device, the front surface and the back surface of each display device 1 are electrically connected to each other with the side wire 10 made of, for example, Ag. In known display devices including a single light-shielding metal layer to shield a laser beam in an area on the substrate 2 on which side wires 10 are placed, short-circuiting is likely to occur between adjoining two side wires 10 through the single light-shielding metal layer. In contrast, in the present embodiment, the light-shielding metal layer is divided into the first light-shielding metal layer 31 and the second light-shielding metal layer 32 at different positions in a direction in which the layers are stacked. This structure prevents short-circuiting between the adjoining two side wires 10 through the first light-shielding metal layer 31. In the present embodiment, when the overlapping portion LW allows the first light-shielding metal layer 31 and the second light-shielding metal layer 32 to be continuous in a plan view with the laser beam incident through the second surface 2b of the substrate 2, the second insulating layer 32i is less susceptible to thermal damage caused by the laser beam. When the first light-shielding metal layer 31 and the second light-shielding metal layer 32 are electrically floating (in an electrically floating state), the first light-shielding metal layer 31 and the second light-shielding metal layer 32 are less likely to be degraded by electric corrosion. The light-shielding metal layer is divided into the first light-shielding metal layer 31 and the second light-shielding metal layer 32 that are thus less likely to have electrostatic discharge.

As illustrated in FIG. 4, the first light-shielding metal layer 31 and the second light-shielding metal layer 32 are located closer to the laser beam L than the second insulating layer 32i and also the insulating layers being organic flat layers with larger thicknesses (organic insulating layers 24 and 26). This structure reduces thermal damage caused by the laser beam L to the second insulating layer 32*i* and also to the organic insulating layers 24 and 26. In other words, this structure reduces the likelihood of the laser beam L causing sublimated substances from the organic insulating layers 24 and 26 to solidify under heat from the laser beam L and adhere to, for example, the wires on the first surface 2*a*.

Each of the first light-shielding metal layer 31 and the second light-shielding metal layer 32 has a thickness of about 50 nm to 1 μm, but the first light-shielding metal layer 31 may have a larger thickness than the second light-shielding metal layer 32. In this case, the first light-shielding metal layer 31 located closer to the laser beam L efficiently absorbs heat from the laser beam, and the second light-shielding metal layer 32 is less susceptible to the thermal damage from the laser beam. The first light-shielding metal layer 31 may have a thickness larger than one time and less than or equal to five times the thickness of the second light-shielding metal layer 32, but may have a thickness other than these values. With the thickness of the first light-shielding metal layer 31 larger than five times the thickness of the second light-shielding metal layer 32, the display device 1 cannot be thinner.

Although embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

In the display device according to one or more embodiments of the present disclosure, the multiple connection pads that are not easily miniaturized are arranged on the substrate without the frame portion being larger and are less likely to have short-circuiting between the connection pads. Further, the multiple connection pads can be arranged on the substrate with the frame portion being smaller.

INDUSTRIAL APPLICABILITY

The display device according to one or more embodiments of the present disclosure may be a light emission display device such as an LED display device or an organic EL display device, and a liquid crystal display device. The display device according to one or more embodiments of the present disclosure can be used in various electronic devices. Such electronic devices include composite and large display devices (multi-displays), automobile route guidance systems (car navigation systems), ship route guidance systems, aircraft route guidance systems, smartphones, mobile phones, tablets, personal digital assistants (PDAs), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, head-mounted displays (HMDs), digital display watches, and smartwatches.

The present disclosure may be embodied in various forms without departing from the spirit or the main features of the present disclosure. The embodiments described above are thus merely illustrative in all respects. The scope of the present invention is defined not by the description given above but by the claims. Any variation and alterations contained in claims fall within the scope of the present invention.

REFERENCE SIGNS

1, 1*a*, 1*b* display device
2 substrate
2*a* first surface
2*b* second surface
2*c* third surface (side surface)
3 pixel unit
6 light emitter
8 connection pad
81 first connection pad
82 second connection pad
83 third connection pad
10 side wire
L1 first emission control signal line
L2 second emission control signal line
L3 third emission control signal line
m1 first side
m2 second side
m3 third side

The invention claimed is:

1. A display device comprising:
a substrate including a first side and a second side adjoining the first side;
a plurality of light emitters located on the substrate;
a plurality of emission control signal lines located on the substrate to control an emission state or a non-emission state of the plurality of light emitters; and
a plurality of connection pads located at an edge adjacent to the first side of the substrate and at an edge adjacent to the second side of the substrate, the plurality of connection pads being connected to the plurality of emission control signal lines, wherein
the plurality of connection pads includes
a plurality of first connection pads located along the first side of the substrate at the edge adjacent to the first side, the plurality of first connection pads being connected to a first emission control signal line of the plurality of emission control signal lines to control an emission state or a non-emission state of light emitters in a first group of the plurality of light emitters,
a second connection pad located at the edge adjacent to the second side of the substrate, the second connection pad being connected to a second emission control signal line of the plurality of emission control signal lines to control an emission state or a non-emission state of light emitters in a second group of the plurality of light emitters,
the substrate includes a third side adjoining the first side and located opposite to the second side, and
the display device further comprises a third connection pad located at an edge adjacent to the third side of the substrate, and the third connection pad is connected to a third emission control signal line of the plurality of emission control signal lines to control an emission state or a non-emission state of light emitters in a third group of the plurality of light emitters.

2. The display device according to claim 1, further comprising:
a fourth connection pad located at the edge adjacent to the second side of the substrate and connected to a wire other than the second emission control signal line, wherein the second connection pad is located closer to the first side than the fourth connection pad.

3. The display device according to claim 1, wherein the plurality of light emitters includes a plurality of outermost light emitters located along the first side of the substrate at the edge adjacent to the first side, and each of the plurality of first connection pads is located between outermost light emitters of the plurality of outermost light emitters.

4. The display device according to claim 1, wherein the light emitters in the second group are located along the edge adjacent to the second side, and the second connection pad is located between the light emitters in the second group.

5. The display device according to claim 1, wherein the second connection pad is larger than each of the plurality of first connection pads.

6. The display device according to claim 5, wherein the second connection pad includes an extension extending along the second side toward the first side.

7. The display device according to claim 1, wherein the substrate includes a first surface on which the plurality of light emitters is located, a second surface opposite to the first surface, a side surface connecting the first surface and the second surface, and a side wire extending from an edge of the first surface through the side surface to an edge of the second surface, and each of the plurality of first connection pads and the second connection pad is connected to the side wire.

8. The display device according to claim 7, wherein the substrate includes a drive located on the second surface and connected electrically to the side wire.

9. The display device according to claim 1, further comprising:
a fourth connection pad located at the edge adjacent to the third side of the substrate and connected to a wire other than the third emission control signal line, wherein the third connection pad is located closer to the first side than the fourth connection pad.

10. The display device according to claim 1, wherein the light emitters in the third group are located along the edge adjacent to the third side, and the third connection pad is located between the light emitters in the third group.

11. The display device according to claim 1, wherein the third connection pad is larger than each of the plurality of first connection pads.

12. The display device according to claim 1, wherein the third connection pad includes an extension extending along the third side toward the first side.

13. The display device according to claim 1, wherein the substrate includes a first surface on which the plurality of light emitters is located, a second surface opposite to the first surface, a side surface connecting the first surface and the second surface, and a side wire extending from an edge of the first surface through the side surface to an edge of the second surface, and the third connection pad is connected to the side wire.

14. The display device according to claim 1, further comprising:
a power supply connection pad located at the edge adjacent to the second side, the power supply connection pad being connected to a power supply wire to supply a power supply current to the plurality of light emitters.

15. The display device according to claim 1, wherein each of the plurality of light emitters is a micro-light-emitting diode.

16. A composite display device comprising:
a plurality of the display devices according to claim 1, the plurality of display devices being joined to one another on side surfaces of the plurality of display devices,
wherein the plurality of display devices includes a first display device and a second display device,
the first display device has a first side surface adjoining the first side,
the second display device has a second side surface facing the first side surface, and
the first display device and the second display device are joined to each other on the first side surface of the first display device and the second side surface of the second display device.

* * * * *